US006766490B1

United States Patent
Garrabrant et al.

(10) Patent No.: US 6,766,490 B1
(45) Date of Patent: Jul. 20, 2004

(54) REDUCED TABLE SIZE FORWARD ERROR CORRECTING ENCODER

(75) Inventors: Gary Garrabrant, Seattle, WA (US); Katherine Elliott, Seattle, WA (US)

(73) Assignee: palmOne, Inc., Milpitas, CA (US)

( * ) Notice: Subject to any disclaimer, the term of this patent is extended or adjusted under 35 U.S.C. 154(b) by 0 days.

(21) Appl. No.: 09/518,581

(22) Filed: Mar. 3, 2000

(51) Int. Cl.[7] .............................................. H03M 13/15
(52) U.S. Cl. ....................................................... 714/759
(58) Field of Search ................................. 714/757, 759, 714/807

(56) References Cited

U.S. PATENT DOCUMENTS

| | | | | |
|---|---|---|---|---|
| 4,473,902 A | * | 9/1984 | Chen ........................... | 714/759 |
| 4,623,999 A | * | 11/1986 | Patterson .................... | 714/759 |
| 5,517,512 A | * | 5/1996 | Saegusa ...................... | 714/759 |
| 5,596,589 A | * | 1/1997 | Thomsen et al. ........... | 714/759 |
| 6,029,186 A | * | 2/2000 | DesJardins et al. ......... | 708/492 |
| 6,633,672 B1 | * | 10/2003 | Guzik et al. ................. | 382/189 |

* cited by examiner

Primary Examiner—Stephen M. Baker
(74) Attorney, Agent, or Firm—Wagner, Murabito & Hao LLP

(57) ABSTRACT

A method and system for encoding and decoding a sequence of K binary digits using reduced-size lookup tables. The sequence of K binary digits is separated into multiple segments (e.g., a first segment and a second segment). The first segment is used as an index into a first lookup table that contains an encoded version of all combinations of binary digits possible in the first segment. In a similar manner, the second segment is used as an index into a second lookup table that contains an encoded version of all combinations of binary digits possible in the second segment. Using the first lookup table, an encoded sequence is obtained for the first segment, and an encoded sequence is obtained for the second segment using the second lookup table. An encoded sequence for the entire sequence of K binary digits is obtained by combining the encoded sequences for the first and second segments. Two lookup tables are thus used to encode the sequence of K binary digits instead of a single lookup table having $2^K$ entries. The sizes of the two lookup tables are such that, if combined, they would contain fewer than $2^K$ entries, thereby saving memory space in devices with limited memory capacity.

8 Claims, 12 Drawing Sheets

REDUCED TABLE SIZE FORWARD ERROR CORRECTING ENCODER

BACKGROUND OF THE INVENTION

1. Field of the Invention

The present invention relates to the field of data processing systems. Specifically, the present invention relates to a method and system for encoding information in a portable computer system.

2. Related Art

As the components required to build a computer system have reduced in size, new categories of computer systems have emerged. One of the more recent categories of computer systems is the "palmtop" computer system. A palmtop computer system is a computer that is small enough to be held in the hand of a user and is thus "palm-sized."

Because palmtop computer systems are very small, full-sized keyboards are generally not efficient input devices. Instead of a keyboard device, some palmtop computers utilize a touch screen and display an image of a small keyboard thereon. When a particular button is pressed or tapped, a small keyboard image is displayed on the display screen. The user then interacts with the on-screen small keyboard image to enter characters, usually one character at a time. To interact with the displayed keyboard image (e.g., "virtual keyboard"), the user taps the screen location of a character with a pen. That corresponding character is then recognized and added to a data entry field, also displayed on the screen. However, for experienced users, the virtual keyboard input system can be a tedious input process.

Instead of using a keyboard device or a displayed keyboard, many palmtop computers employ a stylus and a digitizer pad as an input system. The pen and digitizer pad combination works well for palmtop computers because the arrangement allows a user to hold the palmtop computer system in one hand while scribing with the stylus onto the digitizer pad with the other hand. Most of these stylus-based palmtop computer systems provide some type of handwriting recognition system.

In addition to using keyboards, virtual keyboards and the digitizer, it has also proven convenient to exchange data between a computer system and a palmtop computer using a communication interface, such as a serial or parallel input port. Many palmtop computers also include an infrared communication port for transmitting data over a wireless link. Other palmtop computers further include a radio receiver/transmitter for transmitting data over a wireless link.

All communication circuits introduce some noise and interference into a signal, whether the signal is analog or digital. In addition, signals are distorted along their transmission path by noise and interference. The noise and interference add elements (errors) to the signals that need to be considered in order to recover the original signal.

Error correcting codes are known in the art and are used to encode and decode a signal in such a way that noise and interference errors can be detected and corrected by examination of the encoded data on the receiving end. In a forward error correcting code, extra (redundant) bits ("parity bits") are added into a stream of data that is to be transmitted to another device. The parity bits are used by the receiving device to detect and correct errors in the received data.

In a block error correcting code, a block of K digits (e.g., a data word) is encoded using a code word of N digits (where N>K). For each sequence of K digits, there is a distinct code word of N digits. The code word is comprised of K data bits and N-K parity bits. Generally, such a code is known as a (N,K) code; certain types of these codes are also called Hamming codes. A total of $2^K$ code words having N digits each is required for $2^K$ data words. Thus, for example, for a data word that is eight (8) bits in length, 256 code words are required.

A typical encoding scheme of the prior art is generalized as mapping K-bit vectors X into N-bit vectors Y using a generator G specific to the code being used, in which:

$$[Y]=[X][G].$$

Thus, for example, if K=8 and N=12, then:

$$[Y_1Y_2Y_3Y_4Y_5Y_6Y_7Y_8Y_9Y_{10}Y_{11}Y_{12}]=[X_1X_2X_3X_4X_5X_6X_7X_8][G].$$

In this example, [Y] would have 8 data bits (X) and 4 parity bits (P):

$$[Y]=[X_1X_2X_3X_4X_5X_6X_7X_8P_1P_2P_3P_4].$$

Once G has been selected, the encoding scheme can be executed in advance for each possible combination of K bits, and the encoded results stored in a lookup table. Accordingly, to encode a K-bit data word, the data word is used as an index into the lookup table to identify the corresponding N-bit code word previously determined using generator G. For K=8 and N=12, for example, the lookup table will have 256 12-bit entries. Table 1 below is an example of such a lookup table.

TABLE 1

Example Prior Art Code Word Lookup Table (K = 8, N = 12)

CodeBook ($ indicates hexadecimal data):

| | | | | | | | |
|---|---|---|---|---|---|---|---|
| $0000, | $0015, | $0026, | $0033, | $0049, | $005C, | $006F, | $007A |
| $008A, | $009F, | $00AC, | $00B9, | $00C3, | $00D6, | $00E5, | $00F0 |
| $0107, | $0112, | $0121, | $0134, | $014E, | $015B, | $0168, | $017D |
| $018D, | $0198, | $01AB, | $01BE, | $01C4, | $01D1, | $01E2, | $01F7 |
| $020B, | $021E, | $022D, | $0238, | $0242, | $0257, | $0264, | $0271 |
| $0281, | $0294, | $02A7, | $02B2, | $02C8, | $02DD, | $02EE, | $02FB |
| $030C, | $0319, | $032A, | $033F, | $0345, | $0350, | $0363, | $0376 |
| $0386, | $0393, | $03A0, | $03B5, | $03CF, | $03DA, | $03E9, | $03FC |
| $040D, | $0418, | $042B, | $043E, | $0444, | $0451, | $0462, | $0477 |
| $0487, | $0492, | $04A1, | $04B4, | $04CE, | $04DB, | $04E8, | $04FD |
| $050A, | $051F, | $052C, | $0539, | $0543, | $0556, | $0565, | $0570 |
| $0580, | $0595, | $05A6, | $05B3, | $05C9, | $05DC, | $05EF, | $05FA |
| $0606, | $0613, | $0620, | $0635, | $064F, | $065A, | $0669, | $067C |

TABLE 1-continued

Example Prior Art Code Word Lookup Table (K = 8, N = 12)

| $068C, | $0699, | $06AA, | $06BF, | $06C5, | $06D0, | $06E3, | $06F6 |
|---|---|---|---|---|---|---|---|
| $0701, | $0714, | $0727, | $0732, | $0748, | $075D, | $076E, | $077B |
| $078B, | $079E, | $07AD, | $07B8, | $07C2, | $07D7, | $07E4, | $07F1 |
| $080E, | $081B, | $0828, | $083D, | $0847, | $0852, | $0861, | $0874 |
| $0884, | $0891, | $08A2, | $08B7, | $08CD, | $08D8, | $08EB, | $08FE |
| $0909, | $091C, | $092F, | $093A, | $0940, | $0955, | $0966, | $0973 |
| $0983, | $0996, | $09A5, | $09B0, | $09CA, | $09DF, | $09EC, | $09F9 |
| $0A05, | $0A10, | $0A23, | $0A36, | $0A4C, | $0A59, | $0A6A, | $0A7F |
| $0A8F, | $0A9A, | $0AA9, | $0ABC, | $0AC6, | $0AD3, | $0AE0, | $0AF5 |
| $0B02, | $0B17, | $0B24, | $0B31, | $0B4B, | $0B5E, | $0B6D, | $0B78 |
| $0B88, | $0B9D, | $0BAE, | $0BBB, | $0BC1, | $0BD4, | $0BE7, | $0BF2 |
| $0C03, | $0C16, | $0C25, | $0C30, | $0C4A, | $0C5F, | $0C6C, | $0C79 |
| $0C89, | $0C9C, | $0CAF, | $0CBA, | $0CC0, | $0CD5, | $0CE6, | $0CF3 |
| $0D04, | $0D11, | $0D22, | $0D37, | $0D4D, | $0D58, | $0D6B, | $0D7E |
| $0D8E, | $0D9B, | $0DA8, | $0DBD, | $0DC7, | $0DD2, | $0DE1, | $0DF4 |
| $0E08, | $0E1D, | $0E2E, | $0E3B, | $0E41, | $0E54, | $0E67, | $0E72 |
| $0E82, | $0E97, | $0EA4, | $0EB1, | $0ECB, | $0EDE, | $0EED, | $0EF8 |
| $0F0F, | $0F1A, | $0F29, | $0F3C, | $0F46, | $0F53, | $0F60, | $0F75 |
| $0F85, | $0F90, | $0FA3, | $0FB6, | $0FCC, | $0FD9, | $0FEA, | $0FFF |

A problem with this prior art approach is that the lookup tables are large in size and therefore require a large amount of memory. For longer data words and/or code words, this problem is made even worse. For example, increasing the size of the data word by one bit (from 8 bits to 9) doubles the number of entries required in the lookup table, from 256 entries to 512; each additional bit in the data word doubles the size of the lookup table.

In a palmtop computer system, the amount of memory space is limited relative to desktop computer systems (e.g., personal computers), and therefore memory space is invaluable and needs to be efficiently used. In addition, it may take longer to complete the encoding and decoding processes using large lookup tables.

Consumer preferences are for palmtops and other such devices to be as small, light and fast as possible. As such, it is desirable to use the memory space available, as well as to perform necessary functions such as encoding and decoding, as efficiently as possible.

SUMMARY OF THE INVENTION

Accordingly, what is needed is a system or method for efficiently encoding and decoding a digital data stream in accordance with the limited resources available in palmtop computer systems and other small, low-power devices. In particular, what is needed is a system or method that satisfies the above need and that does not consume a large amount of the available memory space in such devices. The present invention provides these advantages and others not specifically mentioned above but described in the sections to follow.

A method and system are described for encoding and decoding a sequence of K binary digits using reduced-size lookup tables. In the present embodiment, the sequence of K binary digits is separated into multiple segments (for example, a first segment and a second segment), The first segment is used as an index into a first lookup table that contains an encoded sequence corresponding to each of the possible combinations of binary digits in the first segment. Similarly, the second segment is used as an index into a second lookup table that contains an encoded sequence corresponding to each of the possible combinations of binary digits in the second segment. Using the first lookup table, an encoded sequence is obtained for the first segment, and an encoded sequence is obtained for the second segment using the second lookup table. An encoded sequence for the entire sequence of K binary digits is obtained by combining the encoded sequences for the first and second segments.

In other embodiments, the K binary digits are separated into more than two segments. Accordingly, in these embodiments, more than two lookup tables are used to encode the K binary digits in a manner similar to that just described.

Hence, in accordance with the present invention, instead of a single lookup table with $2^K$ entries, multiple reduced-size lookup tables are used to encode a sequence of K binary digits. The total number of entries in the reduced-size lookup tables is less than $2^K$ entries, thereby saving memory space in devices with limited memory capacity, such as palmtop computers.

In the present embodiment, an error correcting code is used to generate the encoded sequences that are stored in the reduced-size lookup tables. In one embodiment, the error correcting code is a Hamming code.

In one embodiment, the encoded sequences for the first and second segments are combined using a binary add XOR (exclusive or) operation.

In another embodiment, the sequence of K binary digits to be encoded are substantially compliant with the Mobitex standard.

DETAILED DESCRIPTION OF THE INVENTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "separating" or "indexing" or "forming" or "generating" or "storing" or "using" or "combining" or "adding" or the like, refer to the action and processes of a computer system (e.g., processes 600, 665, 700 and 750 of FIGS. 6A, 6B, 7A and 7B, respectively), or similar electronic computing device, that manipulates and transforms data represented as physical (electronic) quantities within the computer system's registers and memories into other data similarly represented as physical quantities within the computer system memories or registers or other such information storage, transmission or display devices.

Exemplary Palmtop Platform

Figure 1:
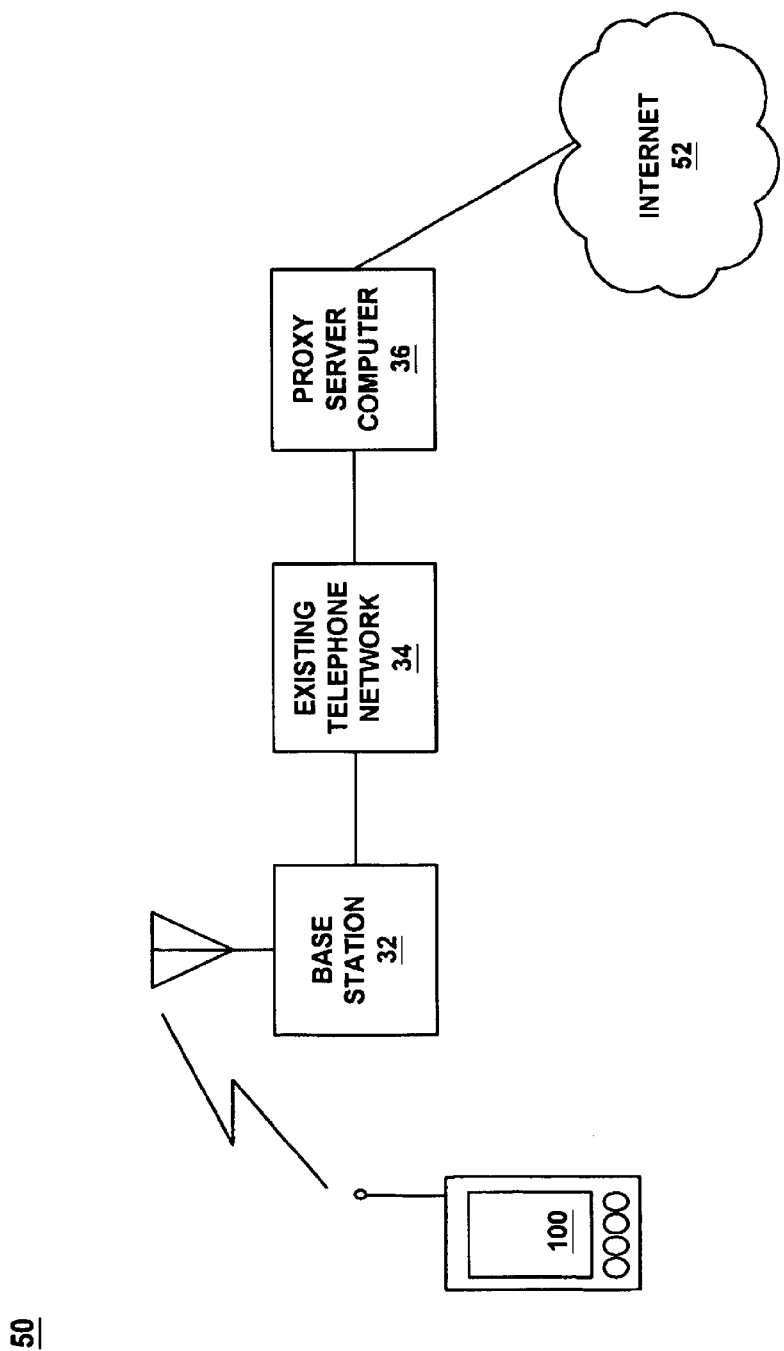
FIG. 1 is a block diagram of an exemplary network environment including a palmtop computer system in accordance with one embodiment of the present invention.

FIG. 1 is a block diagram of an exemplary network environment 50 including a portable computer system 100 in accordance with one embodiment of the present invention. Portable computer system 100 is also known as a palmtop or palm-sized computer system. Portable computer system 100 has the ability to transmit and receive data and information over a wireless communication interface (e.g., a radio interface).

In the present embodiment, base station 32 is both a transmitter and receiver base station which can be implemented by coupling it into an existing public telephone network 34. Implemented in this manner, base station 32 enables portable computer system 100 to communicate with a proxy server computer system 36, which is coupled by wire to the existing public telephone network 34. Furthermore, proxy server computer system 36 is coupled to the Internet 52, thereby enabling portable computer system 100 to communicate with the Internet 52. It should be appreciated that within the present embodiment, one of the functions of proxy server 36 is to perform operations over the Internet 52 on behalf of portable computer system 100. For example, proxy server 36 has a particular Internet address and acts as a proxy device for portable computer system 100 over the Internet 52. It should be further appreciated that other embodiments of a communications network may be utilized in accordance with the present invention.

The data and information which are communicated between base station 32 and portable computer system 100 are the same type of information and data that can conventionally be transferred and received over a public telephone wire network system. However, a wireless communication interface is utilized to communicate data and information between portable computer system 100 and base station 32. It should be appreciated that one embodiment of a wireless communication system in accordance with the present invention is the Mobitex wireless communication system.

Figure 2:
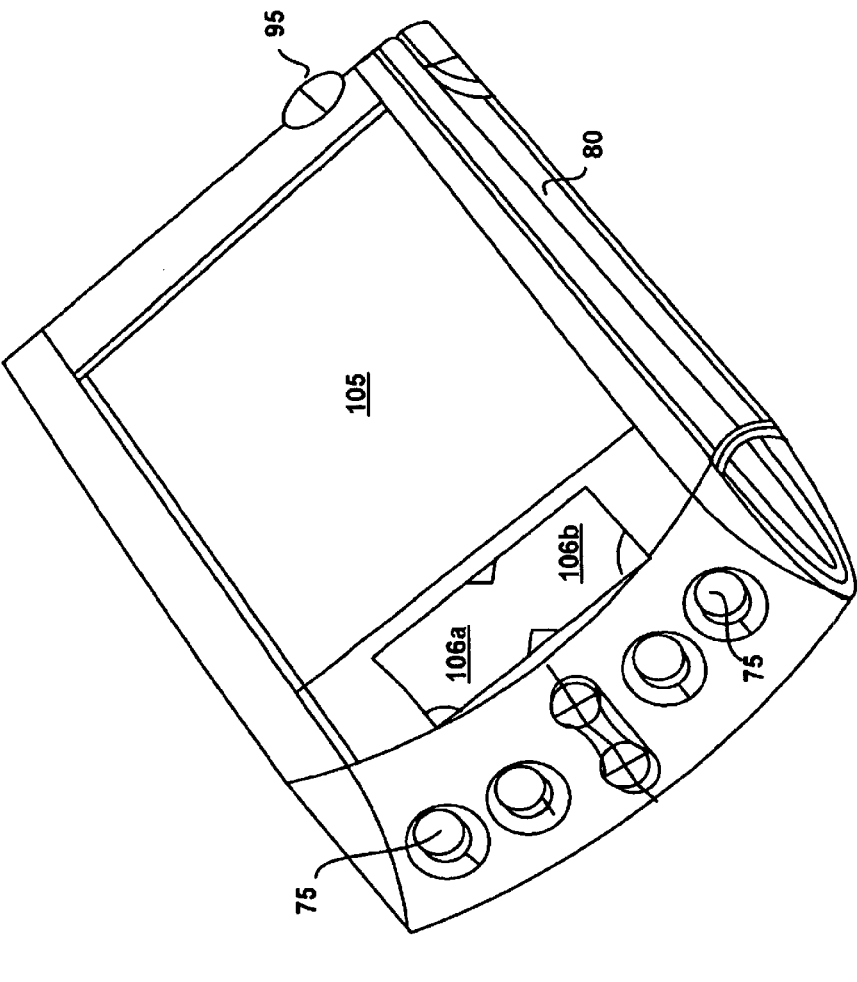
FIG. 2 is a top side perspective view of a palmtop computer system in accordance with one embodiment of the present invention.

FIG. 2 is a perspective illustration of the top face 100a of one embodiment of the palmtop computer system 100 of the present invention. The top face 100a contains a display screen 105 surrounded by a bezel or cover. A removable stylus 80 is also shown. The display screen 105 is a touch screen able to register contact between the screen and the tip of the stylus 80. The stylus 80 can be of any material to make contact with the screen 105. The top face 100a also contains one or more dedicated and/or programmable buttons 75 for selecting information and causing the computer system to implement functions. The on/off button 95 is also shown.

FIG. 2 also illustrates a handwriting recognition pad or "digitizer" containing two regions 106a and 106b. Region 106a is for the drawing of alphabetic characters therein (and not for numeric characters) for automatic recognition, and region 106b is for the drawing of numeric characters therein (and not for alphabetic characters) for automatic recognition. The stylus 80 is used for stroking a character within one of the regions 106a and 106b. The stroke information is then fed to an internal processor for automatic character recognition. Once characters are recognized, they are typically displayed on the screen 105 for verification and/or modification.

Figure 3:
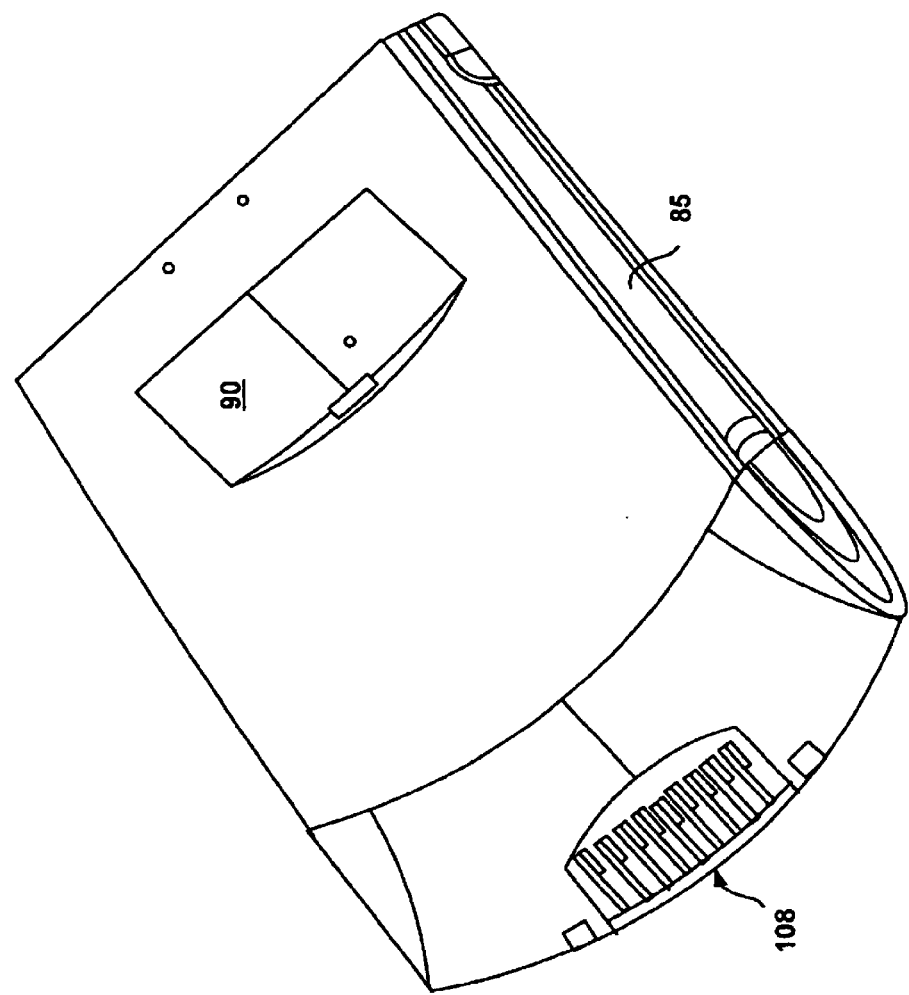
FIG. 3 is a bottom side perspective view of the palmtop computer system of FIG. 2.

FIG. 3 illustrates the bottom side 100b of one embodiment of the palmtop computer system that can be used in accordance with various embodiments of the present invention. An extendible antenna 85 is shown, and also a battery storage compartment door 90 is shown. A communication interface 180 is also shown. In one embodiment of the present invention, the communication interface 180 is a serial communication port, but could also alternatively be of any of a number of well-known communication standards and protocols, e.g., parallel, SCSI (small computer system interface), Firewire (IEEE 1394), Ethernet, etc.

Figure 4:
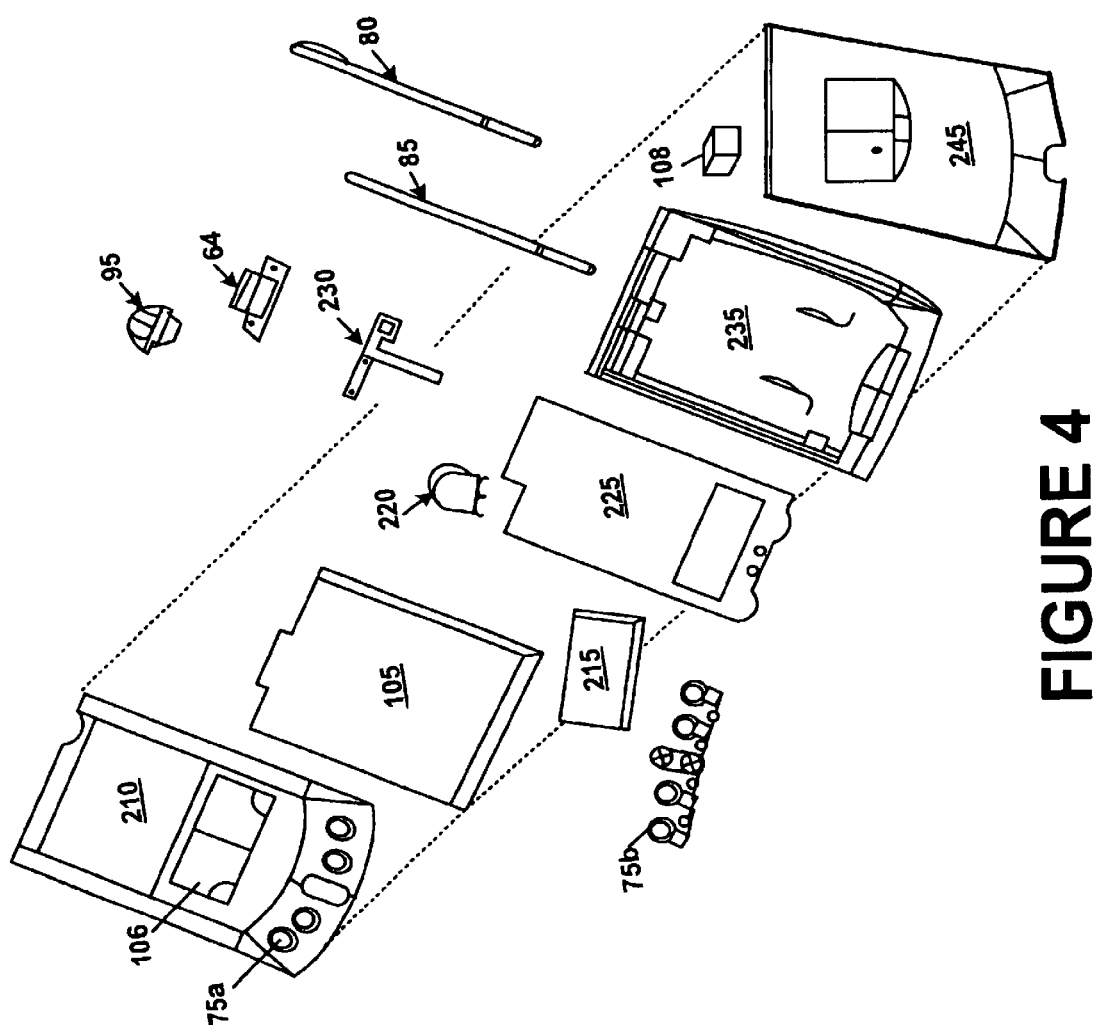
FIG. 4 is an exploded view of the components of the palmtop computer system of FIG. 2.

FIG. 4 is an exploded view of the palmtop computer system 100 in accordance with one implementation. Computer system 100 contains a front cover 210 having an outline of region 106 and holes 75a for receiving buttons 75b. A flat panel display 105 (both liquid crystal display and touch screen) fits into front cover 210. Any of a number of display technologies can be used, e.g., liquid crystal display (LCD), field emission display (FED), plasma, etc., for the flat panel display 105. A battery 215 provides electrical power. A contrast adjustment (potentiometer) 220 is also shown. On/off button 95 is shown along with an infrared emitter and detector device 64. A flex circuit 230 is shown along with a personal computer (PC) board 225 containing electronics and logic (e.g., memory, communication bus, processor, etc.) for implementing computer system functionality. The digitizer pad is also included in PC board 225. A midframe 235 is shown along with stylus 80. Position-adjustable antenna 85 is shown.

A signal (e.g., radio) receiver/transmitter device 108 is also shown between the midframe and the rear cover 245 of FIG. 4. The receiver/transmitter device 108 is coupled to the antenna 85 and also coupled to communicate with the PC board 225. In one implementation the Mobitex wireless communication system is used to provide two-way communication between computer system 100 and other networked computers and/or the Internet via a proxy server (see FIG. 1).

Figure 5:
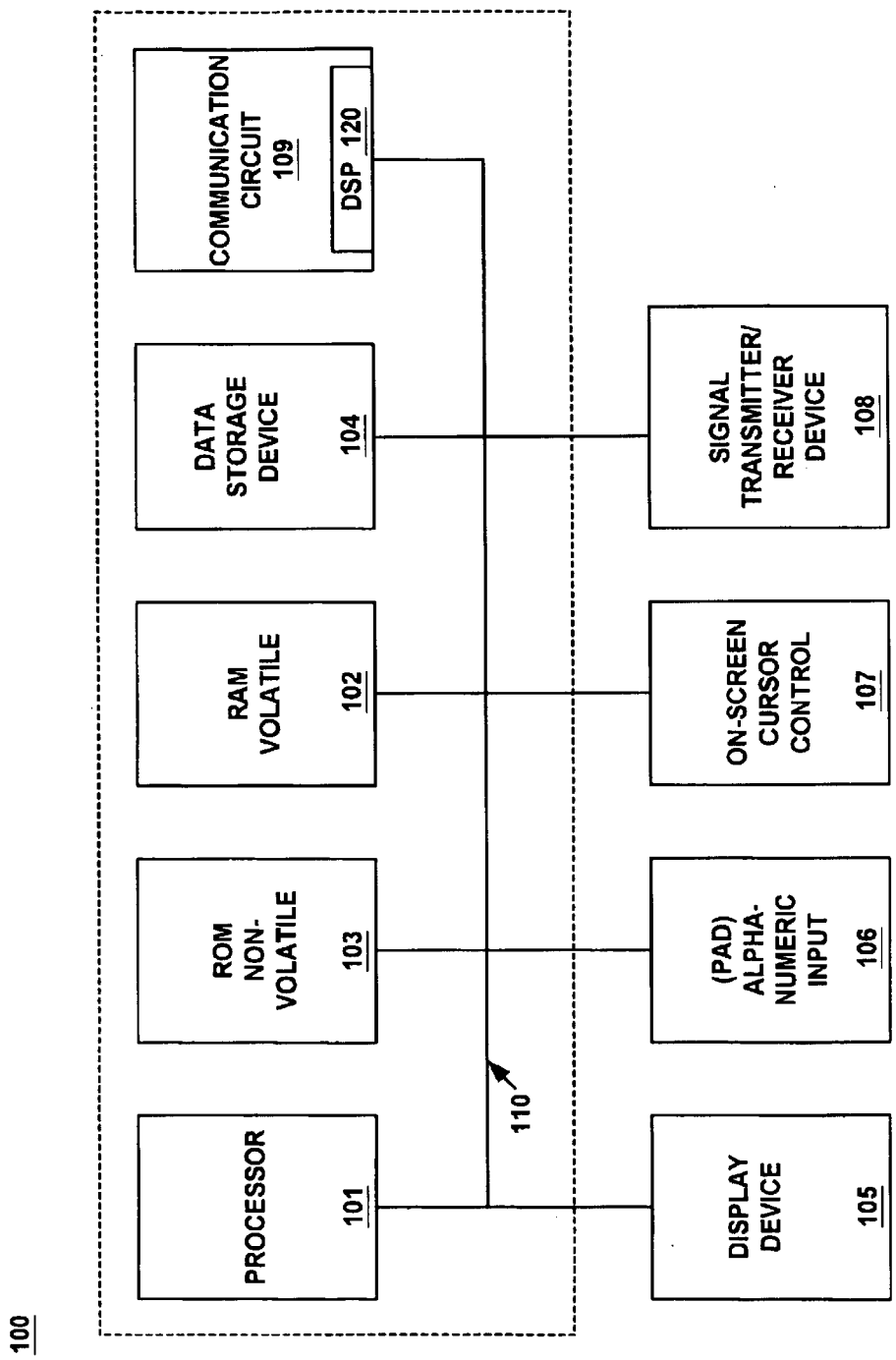
FIG. 5 is a block diagram of one embodiment of a palmtop computer system in accordance with the present invention.

FIG. 5 illustrates circuitry of computer system 100, some of which can be implemented on PC board 225 (FIG. 4). Computer system 100 includes an address/data bus 110 for communicating information, a central processor 101 coupled with the bus for processing information and instructions, a volatile memory 102 (e.g., random access memory, RAM) coupled with the bus 110 for storing information and instructions for the central processor 101 and a non-volatile memory 103 (e.g., read only memory, ROM) coupled with the bus 110 for storing static information and instructions for the processor 101. Computer system 100 also includes an optional data storage device 104 (e.g., memory stick) coupled with the bus 110 for storing information and instructions. Device 104 can be removable. As described above, computer system 100 also contains a display device 105 coupled to the bus 110 for displaying information to the computer user. PC board 225 can contain the processor 101, the bus 110, the ROM 103 and the RAM 102.

With reference still to FIG. 5, computer system 100 also includes a signal transmitter/receiver device 108 which is coupled to bus 110 for providing a physical communication link between computer system 100 and a network environment (e.g., network environment 50 of FIG. 1). As such, signal transmitter/receiver device 108 enables central processor unit 101 to communicate wirelessly with other electronic systems coupled to the network. It should be appreciated that within the present embodiment, signal transmitter/receiver device 108 is coupled to antenna 85 (FIG. 4) and provides the functionality to transmit and receive information over a wireless communication interface. It should be further appreciated that the present embodiment of signal transmitter/receiver device 108 is well-suited to be implemented in a wide variety of ways. For example, signal transmitter/receiver device 108 could be implemented as a modem.

In one embodiment, computer system 100 includes a communication circuit 109 coupled to bus 110. Communication circuit 109 includes an optional digital signal processor (DSP) 120 for processing data to be transmitted or data that are received via signal transmitter/receiver device 108. Additional information regarding the functions of communication circuit 109 are provided in conjunction with FIGS. 6A and 6B. Alternatively, some or all of the functions performed by DSP 120 can be performed by processor 101.

Also included in computer system 100 of FIG. 5 is an optional alphanumeric input device 106 which in one implementation is a handwriting recognition pad ("digitizer") having regions 106a and 106b (FIG. 2), for instance. Alphanumeric input device 106 can communicate information and command selections to processor 101. Computer system 100 also includes an optional cursor control or directing device (on-screen cursor control 107) coupled to bus 110 for communicating user input information and command selections to processor 101. In one implementation, on-screen cursor control device 107 is a touch screen device incorporated with display device 105. On-screen cursor control device 107 is capable of registering a position on display device 105 where the stylus makes contact. The display device 105 utilized with computer system 100 may be a liquid crystal display device, a cathode ray tube (CRT), a field emission display device (also called a flat panel CRT) or other display device suitable for creating graphic images and alphanumeric characters recognizable to the user. In the preferred embodiment, display device 105 is a flat panel display.

Processes for Transmitting and Receiving Data

Figure 6A:
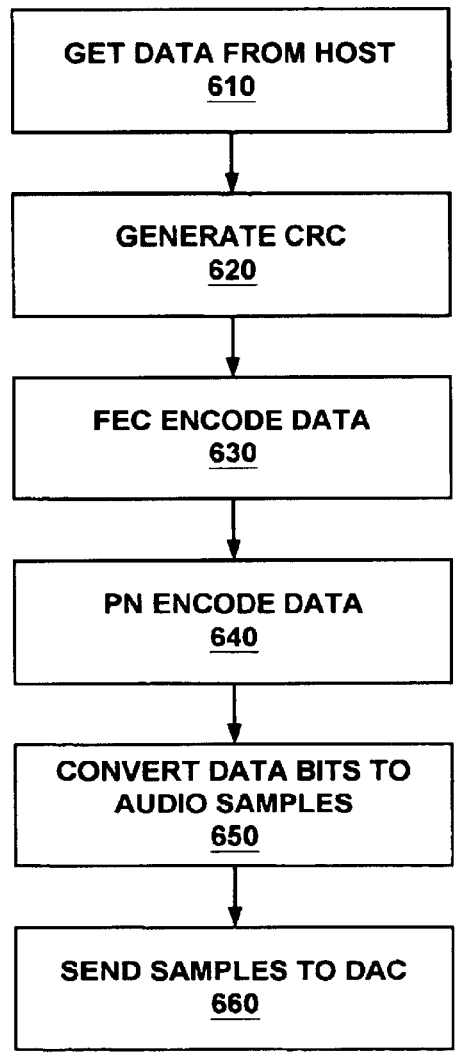
FIG. 6A is a flowchart of the steps in a process for transmitting data in accordance with one embodiment of the present invention.

FIG. 6A is a flowchart of the steps in a process 600 for encoding data to be transmitted over a wireless link from a palmtop computer system (e.g., computer system 100 of FIG. 1) in accordance with one embodiment of the present invention. In one embodiment, process 600 is implemented by communication circuit 109 (specifically, DSP 120) of FIG. 5. In another embodiment, process 600 is implemented using processor 101 (FIG. 5) in lieu of DSP 120.

In step 610 of FIG. 6A, the data to be transmitted are received into process 600 from the host (e.g., from computer system 100 memory). In step 620 of FIG. 6A, a procedure for generating bit values for the cyclic redundancy check (CRC) is implemented.

In step 630, in the present embodiment, the data are encoded using an error correcting code. In one embodiment, a forward error correcting (FEC) code, such as a Hamming code, is used. In accordance with the present invention, the FEC encoding is performed using reduced-size lookup tables which are memory efficient. The reduced-size lookup tables occupy less space in memory than a single full-sized lookup table, and therefore are advantageously used in devices with limited memory space such as palmtop computers. Additional information regarding the use of reduced-size lookup tables in accordance with the present invention is provided in conjunction with FIGS. 7A, 7B, 8A and 8B.

In step 640, pseudonoise (PN) encoding of the data is performed. In step 650, the encoded data bits are converted to samples (e.g., audio samples, although other types of data may be used). In step 660, the samples are sent to a digital-to-analog converter (DAC). The encoded signals are then transmitted to a receiving device.

Figure 6B:
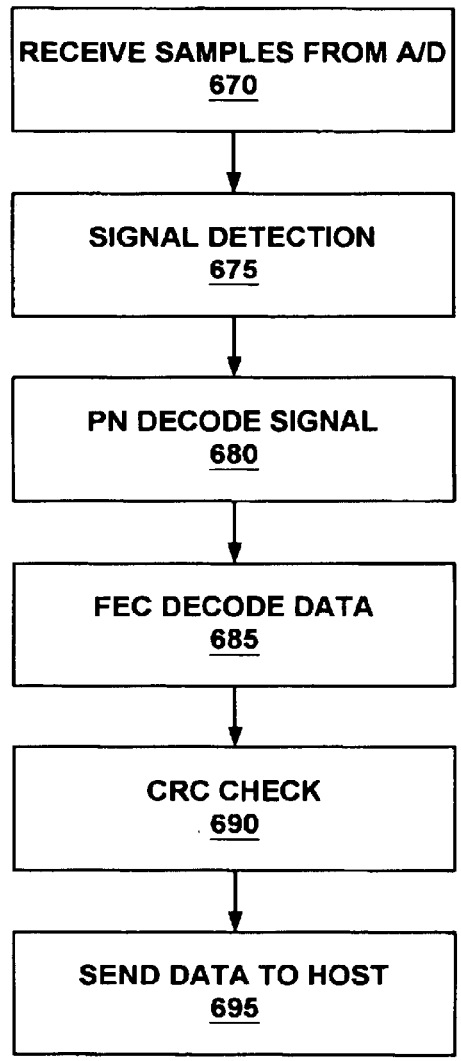
FIG. 6B is a flowchart of the steps in a process for receiving data in accordance with one embodiment of the present invention.

FIG. 6B is a flowchart of the steps in a process 665 for decoding and detecting errors in data received by a palmtop computer system (e.g., computer system 100 of FIG. 1) over a wireless link in accordance with one embodiment of the present invention. In one embodiment, process 665 is implemented by communication circuit 109 (specifically, DSP 120) of FIG. 5. In another embodiment, process 665 is implemented using processor 101 (FIG. 5) in lieu of DSP 120.

In step 670 of FIG. 6B, an analog signal is received by the receiver (e.g., signal transmitter/receiver device 108 of FIG. 5) and fed into an analog-to-digital converter (A/D). Digital samples are extracted and provided to step 675 of process 665 from the A/D converter.

In step 675 of FIG. 6B, the digital samples are provided to a detector for signal detection. In step 680, PN decoding of the digital samples is performed.

In step 685, in the present embodiment, the digital data are decoded using a FEC code such as a Hamming code. In accordance with the present invention, the FEC decoding is performed using reduced-size lookup tables which are memory efficient. Additional information regarding the use of reduced-size lookup tables in accordance with the present invention is provided in conjunction with FIGS. 7A, 7B and 9.

In step 690 of FIG. 6B, the CRC is implemented to verify the data were correctly received. In step 695, the data (when correct) are sent to the host (e.g., to computer system 100 memory).

Error Correcting Encoding and Decoding with Reduced-Size Lookup Tables

Figure 7A:
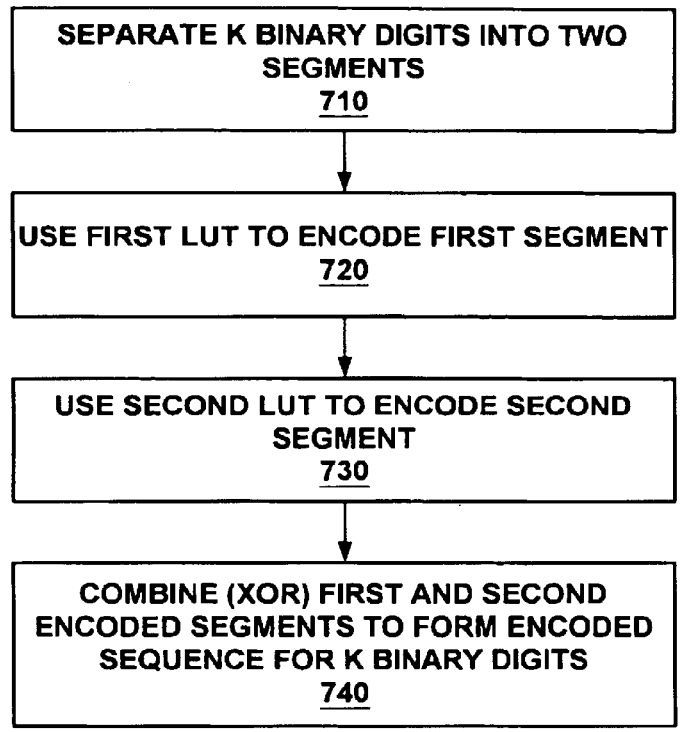
FIG. 7A is a flowchart of the steps in a process for encoding a sequence of data bits using reduced-size lookup tables in accordance with an embodiment of the present invention.

FIG. 7A is a flowchart of the steps in a process 700 for encoding a sequence of data bits in accordance with an embodiment of the present invention. Process 700 can be implemented by computer system 100 (FIG. 5) as computer-readable program instructions stored in a memory unit (e.g., ROM non-volatile 103 of FIG. 5) and executed by a processor (e.g., processor 101 or DSP 120 of FIG. 5). It is appreciated that process 700 may be applied in devices other than a palmtop computer where it is desirable to conserve memory space. Furthermore, it is appreciated that process 700 can be used in other applications where it is necessary or desirable to encode or decode a sequence of data bits.

In one embodiment, process 700 is implemented in the FEC encode step of process 600 (step 630 of FIG. 6A). In another embodiment, process 700 is implemented in the FEC decode step (step 685 of FIG. 6B).

In step 710 of FIG. 7A, the data to be encoded are separated into a multiplicity of smaller segments. For example, a sequence of K binary digits can be separated into two segments, although it is appreciated that more than two segments can be used in accordance with the present invention. In the present embodiment, the K binary digits are separated into segments of equal length (that is, each segment has the same number of digits), and the order of the K binary digits is maintained in the segments.

In step 720, a first lookup table (LUT) is used to encode the first segment. The first lookup table contains an encoded sequence for each of the possible combinations of digits in the first segment. The digits in the first segment are used as an index to locate in the first lookup table the encoded sequence corresponding to the particular combination of digits in the first segment.

In step 730, a similar approach as that just described is used to locate in a second lookup table the encoded sequence corresponding to the particular combination of digits in the second segment. If the sequence of K binary digits is separated into more than two segments, additional lookup tables are used to encode these additional segments.

In accordance with the present invention, the lookup tables used in steps 720 and 730 are of reduced size relative to a full-sized lookup table and therefore occupy less space in memory. A full-sized lookup table containing an entry for each possible combination K bits would have $2^K$ entries. For the case in which the K binary digits are separated into two equal segments of K/2 bits each, the first lookup table and the second lookup table would each have $2^{(K/2)}$ entries. For example, for K=8, a full-sized lookup table would have 256 entries, while two reduced-size lookup tables would each have only 16 entries, or 32 entries in total (one-eighth the number of entries of the full-sized table). The reduced-size lookup tables therefore would occupy approximately one-eighth as much memory as a full-sized table. Thus, the reduced-size lookup tables are advantageously used in devices with limited memory space such as palmtop computers.

In accordance with the present embodiment of the present invention, the encoded sequences contained in the reduced-size lookup tables are generated in advance and stored. Additional information with regard to how the lookup tables are generated is provided in conjunction with FIG. 7B.

By generating the encoded sequences in advance, it is not necessary to perform the associated calculations in real time as the data are received by communication circuit 109. This provides a number of advantages, in particular for lower power devices such as palmtop computer systems. For example, looking up an encoded value in a table can be accomplished efficiently, using fewer processor cycles than a calculation of that encoded value. Because fewer processor cycles are used, power consumption is reduced and so a smaller battery can be used, keeping the device small in size and light in weight. In addition, the calculation can be performed outside of the lower power device using a more powerful host computer system and then downloaded into the device.

Continuing with reference to FIG. 7A, in step 740, the encoded sequences for each of the segments (from steps 720 and 730) are combined to form an encoded sequence for the entire sequence of K binary digits. In the present embodiment, the encoded sequences for the segments are combined using an XOR (exclusive or) operation (also referred to as a binary add or a modulo-2 operation). The encoded sequence for the K binary digits that is calculated in accordance with the present invention (using reduced-size lookup tables) is the same as the encoded sequence that would be generated using a full-sized lookup table.

Figure 7B:
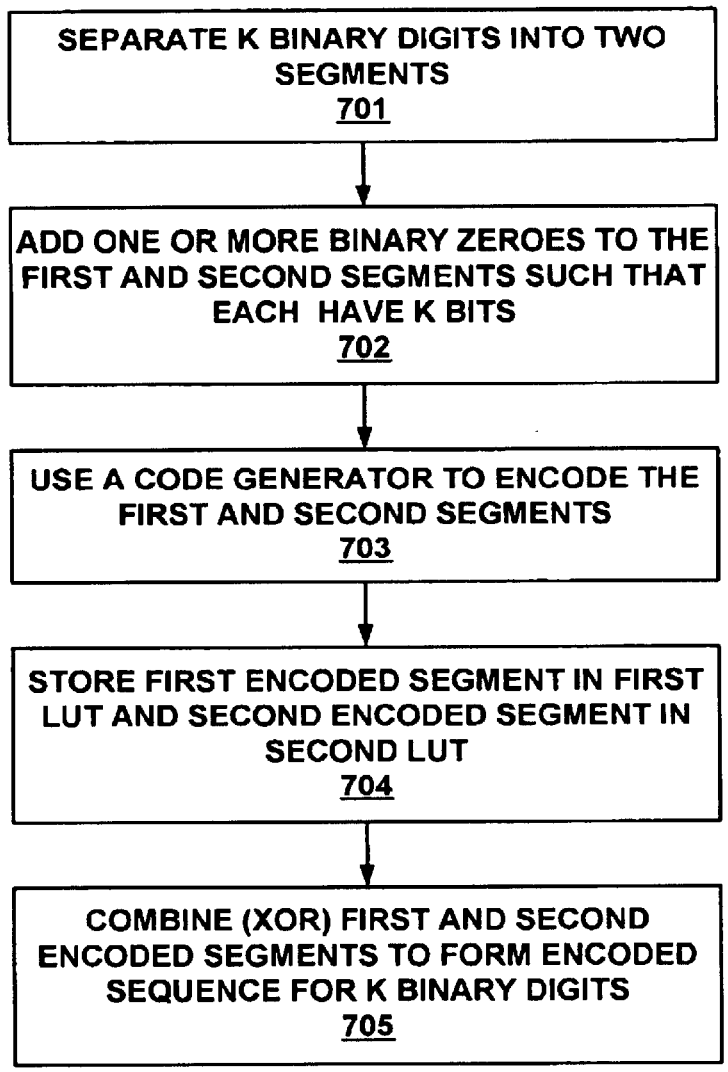
FIG. 7B is a flowchart of the steps in a process for encoding a sequence of bits using reduced-size lookup tables in accordance with another embodiment of the present invention.

FIG. 7B is a flowchart of the steps in a process 750 for encoding a sequence of bits in accordance with another embodiment of the present invention. Process 750 can be implemented by computer system 100 (FIG. 5) as computer-readable program instructions stored in a memory unit (e.g., ROM non-volatile 103 of FIG. 5) and executed by a processor (e.g., processor 101 or DSP 120 of FIG. 5). It is appreciated that process 750 may be applied in devices other than a palmtop computer where it is desirable to conserve memory space. Furthermore, it is appreciated that process 750 can be used in other applications where it is necessary or desirable to encode or decode a sequence of data bits.

In step 701 of FIG. 7B, the sequence of K binary digits that is to be encoded is separated into multiple segments. In the present embodiment, the segments are of equal length and the initial order of the digits is not changed. For example, for K=8, the sequence of binary digits can be represented as $[X_1 X_2 X_3 X_4 X_5 X_6 X_7 X_8]$. For the case in which the sequence is separated into two segments of equal length, the first segment can be represented as $[X_1X_2X_3X_4]$ and the second segment as $[X_5X_6X_7X_8]$.

In the present embodiment, the sequence of binary digits is separated into two segments, although it is appreciated that more than two segments may be used in other embodiments. It will be obvious to one of ordinary skill in the art how the discussion below can be extrapolated to address those cases in which more than two segments are used.

In step 702 of FIG. 7B, binary zeroes are added to each segment so that the number of digits in each segment is equal to K. In the present embodiment, the binary zeroes are placed so that the binary digits in the initial sequence of K binary digits maintain their place. Thus, continuing the example above, the first segment is represented as $[X_1X_2X_3X_40000]$ and the second segment as $[0000X_5X_6X_7X_8]$.

In step 703 of FIG. 7B, each of the segments is encoded using a code generator G. A typical encoding scheme is usually generalized as mapping K-bit vectors X into N-bit vectors Y using a generator G specific to the code being used, in which:

$$[Y]=[X][G];$$

where $Y=[Y_1Y_2Y_3Y_4Y_5Y_6Y_7Y_8Y_9Y_{10}Y_{11}\ldots Y_N]$. Thus, if $[Y]_1$ represents the encoded version of the first segment and $[Y]_2$ represents the encoded version of the second segment, then:

$$[Y]_1=[X_1X_2X_3X_40000][G]; \text{ and}$$

$$[Y]_2=[0000X_5X_6X_7X_8][G].$$

In step 704, the encoded version of the first segment $[Y]_1$ is stored in a first lookup table, and the encoded version of the second segment $[Y]_2$ is stored in a second lookup table.

In step 705, in the present embodiment, the encoded version of the first segment $[Y]_1$ and the encoded version of the second segment $[Y]_2$ are retrieved from their respective lookup tables and combined to generate an encoded sequence representing the entire sequence of K binary digits (from step 701). In the present embodiment, the encoded sequences for the first and second segments are combined using an XOR (exclusive or) operation (also referred to as a binary add or a modulo-2 operation).

Thus, for example, if K=8 and N=12, then:

$$[Y_1Y_2Y_3Y_4Y_5Y_6Y_7Y_8Y_9Y_{10}Y_{11}Y_{12}]=[X_1X_2X_3X_4X_5X_6X_7X_8][G].$$

However, as described above, in accordance with the present invention:

$$[X_1X_2X_3X_4X_5X_6X_7X_8]=[X_1X_2X_3X_40000]+[0000X_5X_6X_7X_8].$$

Accordingly:

$$[Y_1Y_2Y_3Y_4Y_5Y_6Y_7Y_8Y_9Y_{10}Y_{11}Y_{12}]=[X_1X_2X_3X_40000]+[0000X_5X_6X_7X_8][G].$$

In this example, [Y] would have 8 data bits ($X_i$) and 4 parity bits ($P_i$):

$$[Y]=[X_1X_2X_3X_4X_5X_6X_7X_8P_1P_2P_3P_4].$$

Figure 8A:
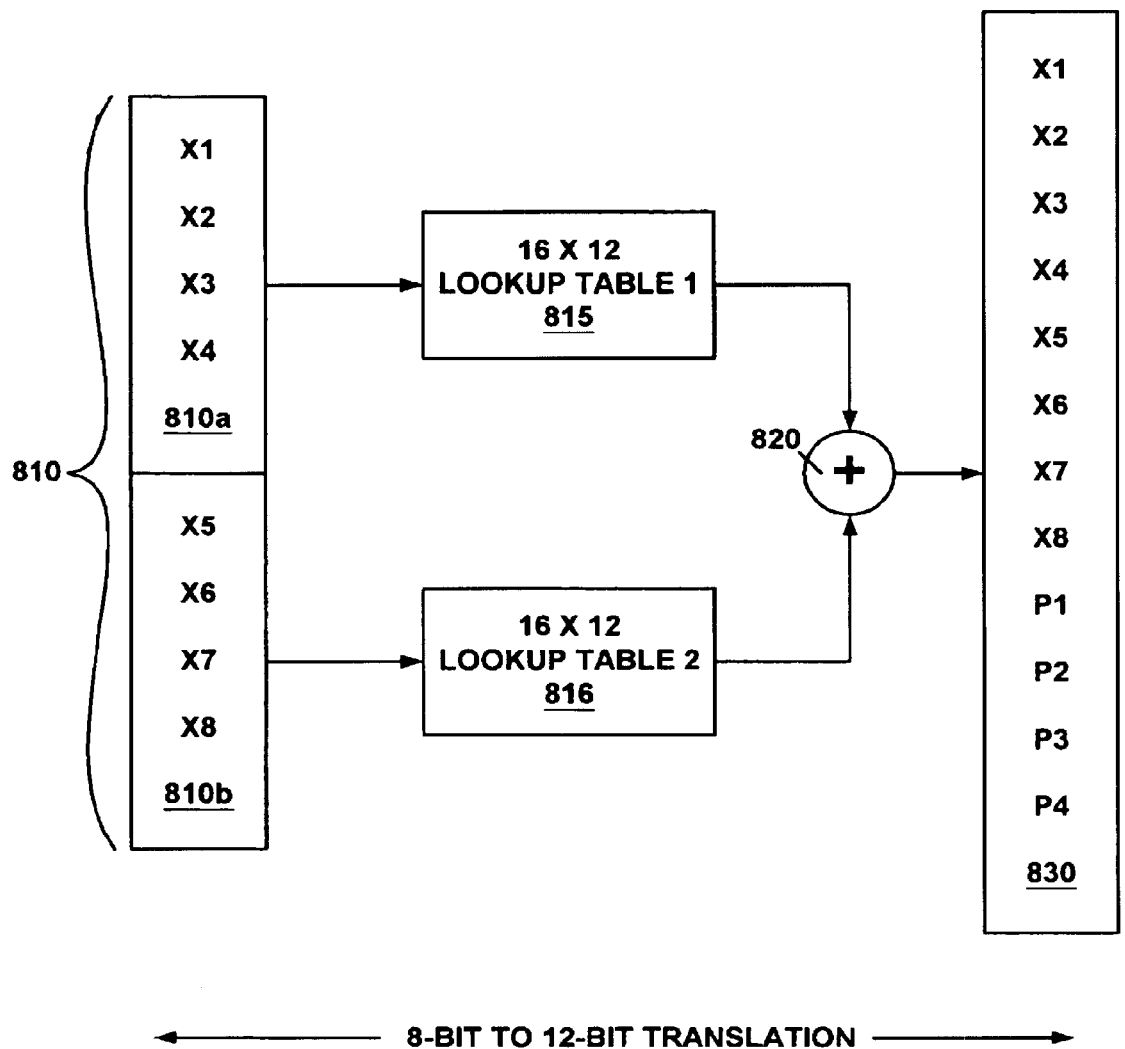
FIGS. 8A and 8B illustrate example cases in which a sequence of bits are encoded using reduced-size lookup tables in accordance with an embodiment of the present invention.
Figure 8B:
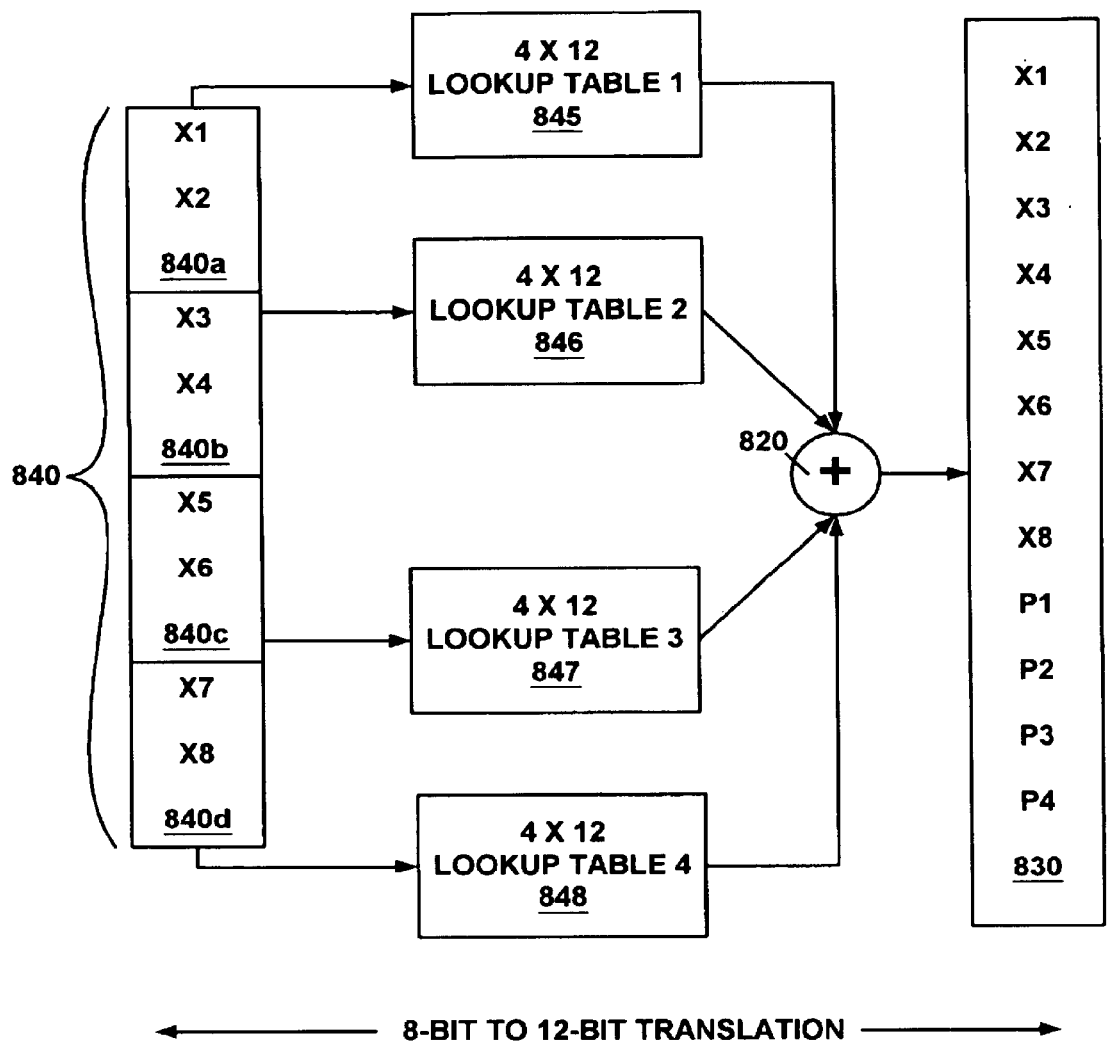

FIGS. 8A and 8B illustrate example cases in which a sequence of bits are encoded using reduced-size lookup tables in accordance with an embodiment of the present invention. In these examples, K is equal to 8 and N is equal to 12 (that is, the encoding scheme maps 8 bits into 12 bits).

With reference first to FIG. 8A, the 8-bit sequence 810 is separated into two 4-bit sequences 810a and 810b. The bits in sequence 810a are used as an index into lookup table 1 (815), which contains an encoded sequence corresponding to each possible combination of digits in sequence 810a. Similarly, the bits in sequence 810b are used as an index into lookup table 2 (816). The encoded versions of sequences 810a and 810b are retrieved from the lookup tables, and combined using binary adder 820 (e.g., an XOR gate) to generate encoded sequence 830. Sequence 830 has 8 data bits ($X_i$) and four (4) parity bits ($P_i$).

In accordance with the present invention, lookup tables 815 and 816 each contain only $2^{(K/2)}$ by N entries (that is, 16×12 entries) instead of $2^K \times 12$ (256×12) entries. Thus, lookup tables 815 and 816, if combined, contain only 32×12 entries, or one-eighth the number of entries required by a full-sized lookup table. The memory space required to store lookup tables 815 and 816 is reduced by a commensurate amount relative to the amount of space needed to store a full-sized lookup table.

With reference next to FIG. 8B, the 8-bit sequence 840 is separated into four 2-bit sequences 840a, 840b, 840c and 840d. The bits in sequence 840a are used as an index into lookup table 1 (845), which contains an encoded sequence corresponding to each possible combination of digits in sequence 840a. Similarly, the bits in sequence 840b are used as an index into lookup table 2 (846), the bits in sequence 840c are used as an index into lookup table 3 (847), and the bits in sequence 840d are used as an index into lookup table 4 (848). The encoded versions of sequences 840a, 840b, 840c and 840d are retrieved from the lookup tables, and combined using binary adder 820 (e.g., an XOR gate) to generate encoded sequence 830. Sequence 830 has 8 data bits ($X_i$) and 4 parity bits ($P_i$).

In accordance with the present invention, lookup tables 845, 846, 847 and 848 each contain only $2^{(K/4)}$ by N entries (that is, 4×12 entries) instead of $2^K \times 12$ (256×12) entries. Thus, lookup tables 845, 846, 847 and 848, if combined, contain only 16×12 entries, or one-sixteenth the number of entries required by a full-sized lookup table. The memory space required to store lookup tables 845, 846, 847 and 848 is reduced by a commensurate amount relative to the amount of space needed to store a full-sized lookup table.

Figure 9:
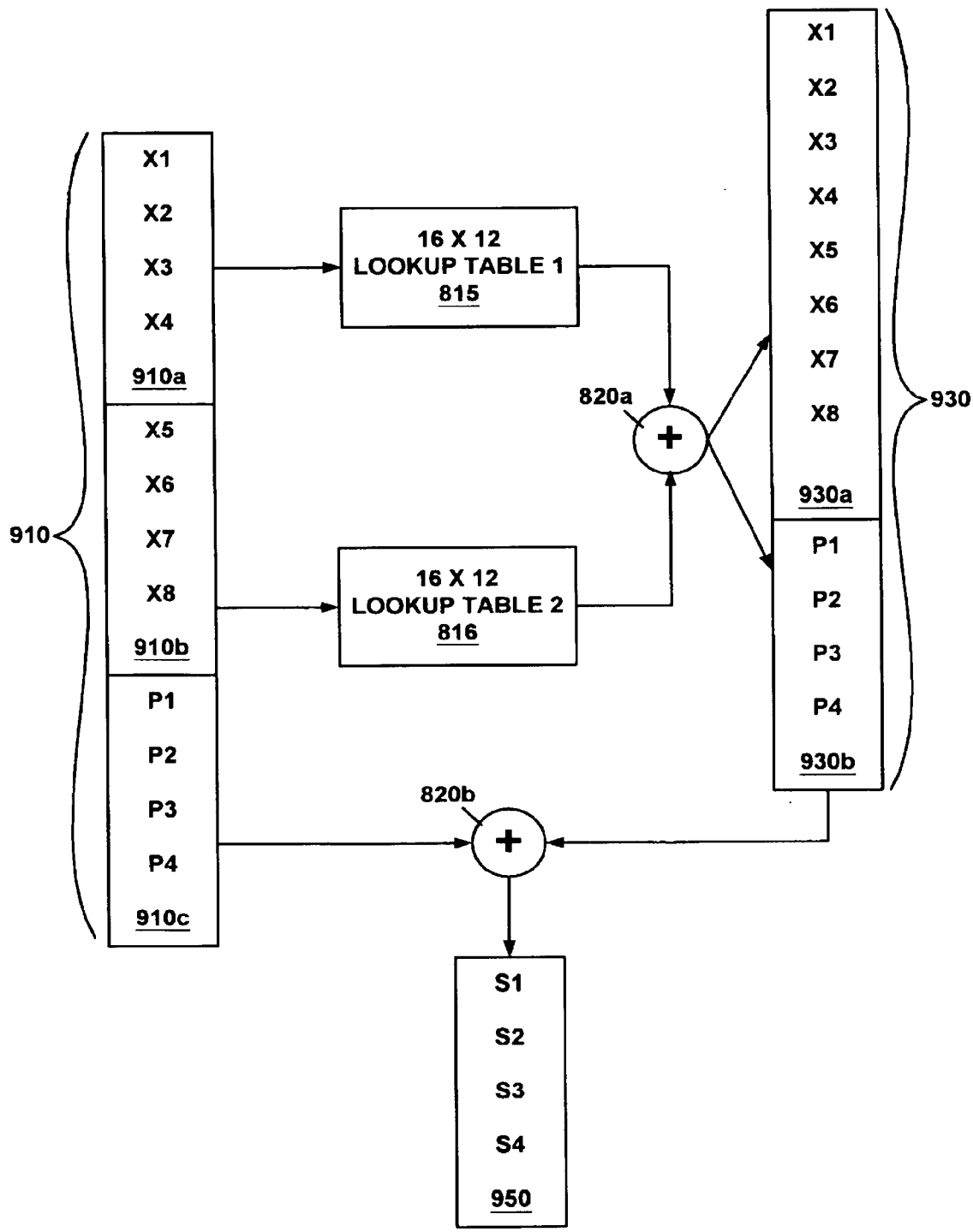
FIG. 9 illustrates an example case in which reduced-size lookup tables are used to decode a sequence of bits in accordance with one embodiment of the present invention.

FIG. 9 illustrates an example case in which reduced-size lookup tables are used for decoding and error detection in a sequence of bits 910 in accordance with one embodiment of the present invention. In this example, K is equal to 8 and N is equal to 12. Thus, the sequence of bits 910 contains 8 data bits ($X_i$) and 4 parity bits ($P_i$).

The 8 data bits ($X_i$) are separated into two 4-bit sequences 910a and 910b. The bits in sequence 910a are used as an index into lookup table 1 (815), which contains an encoded sequence corresponding to each possible combination of digits in sequence 910a. Similarly, the bits in sequence 910b are used as an index into lookup table 2 (816). The encoded versions of sequences 910a and 910b are retrieved from the lookup tables, and combined using binary adder 820a (e.g., an XOR gate) to generate encoded sequence 930. Sequence 930 has 8 data bits (930a) and 4 parity bits (930b).

The 4 parity bits 910c from sequence 910 and the 4 parity bits 930b from sequence 930 are combined using binary adder 820b (e.g., an XOR gate) to generate syndrome 950. Syndrome 950 provides a known means for detecting whether there is an error in sequence 910.

In accordance with the present invention, as described previously in conjunction with FIG. 8A, lookup tables 815 and 816 of FIG. 9, if combined, contain only 32×12 entries, or one-eighth the number of entries required by a full-sized lookup table. The memory space required to store lookup tables 815 and 816 is reduced by a commensurate amount relative to the amount of space needed to store a full-sized lookup table. Thus, in accordance with this embodiment of the present invention, memory space is conserved for the decoding and error correction process (e.g., process 665 of FIG. 6B for received data) as well as for the encoding process (e.g., process 600 of FIG. 6A for data to be transmitted).

Tables 2A and 2B below illustrate example lookup tables containing encoded sequences for the case in which K=8 and N=12 in accordance with one embodiment of the present invention. Table 2A corresponds to the first lookup table (e.g., lookup table 815 of FIGS. 8A and 9) and Table 2B corresponds to the second lookup table (e.g., lookup table 816 of FIGS. 8A and 9). Thus, in accordance with the present invention, a first encoded sequence would be retrieved from Table 2A and a second encoded sequence would be retrieved from Table 2B, and these sequences would be combined to form an encoded sequence for K binary digits.

TABLE 2A

Example First Lookup Table (K = 8, N = 12)

CodeBook1:
$0000, $0107, $020B, $030C, $040D, $050A, $0606, $0701
$080E, $0909, $0A05, $0B02, $0C03, $0D04, $0E08, $0F0F
($ indicates hexadecimal data.)

TABLE 2B

Example Second Lookup Table (K = 8, N = 12)

CodeBook2:
$0000, $0015, $0026, $0033, $0049, $005C, $006F, $007A
$008A, $009F, $00AC, $00B9, $00C3, $00D6, $00E5, $00F0
($ indicates hexadecimal data.)

SUMMARY

In summary, in accordance with the present invention, reduced-size lookup tables are used to encode and decode a sequence of K binary digits instead of a full-sized lookup table. A full-sized lookup table containing an entry for each possible combination of K bits would have $2^K$ entries, whereas for the case in which the K binary digits are separated into two equal segments of K/2 bits each, the reduced-size lookup tables would each have $2^{(K/2)}$ entries and therefore occupy less space in memory. Further reductions in the size of the lookup tables are achieved by separating the sequence of K binary digits into smaller segments. The reduced-size lookup tables are advantageously used in devices with limited memory space such as palmtop computers.

In accordance with the present embodiment of the present invention, the encoded sequences contained in the reduced-size lookup tables are generated in advance and stored. By generating the encoded sequences in advance, it is not necessary to perform the associated calculations in real time, providing a number of advantages in addition to that described above. For example, looking up an encoded value in a table can be accomplished efficiently, using fewer processor cycles than an on-line calculation of that encoded value. As a result, power consumption is reduced and so a smaller battery can be used in a lower power device such as a palmtop computer, keeping the device small in size and light in weight.

Thus, the present invention provides a system and method for efficiently encoding and decoding a digital data stream in accordance with the limited resources available in palmtop computer systems and other small, low-power devices. In addition, the present invention provides a system and method that do not consume a large amount of the available memory space in such devices.

The preferred embodiment of the present invention, a method and system providing a reduced table size forward error correcting encoder, is thus described. While the present invention has been described in particular embodiments, it should be appreciated that the present invention should not be construed as limited by such embodiments, but rather construed according to the below claims.

What is claimed is:
1. A method for encoding an initial sequence of binary digits, said initial sequence having a length of K bits, said method comprising the steps of:
  a) separating, in a portable computer system disposed within a housing that is sized so that it is portable substantially within the hand of a user, said portable computer system comprising a handwriting recognition pad having a first region for alphabetic characters and a second region for numeric characters, said initial sequence of binary digits into a first segment and a second segment, said first segment comprising a first portion of said K bits and said second segment comprising a second portion of said K bits different from said first portion;
  b) adding in said portable computer system one or more binary zeroes to said first segment and to said second segment such that said first segment and said second segment each have a length of K bits;
  c) operating on in said portable computer system said first segment and said second segment with a code generator to generate a first encoded sequence and a second encoded sequence; and
  d) forming in said portable computer system an encoded sequence for said sequence of binary digits by XORing said first encoded sequence and said second encoded sequence.

2. The method as recited in claim 1 wherein said step a) comprises the step of:
   a1) separating said initial sequence of binary digits into segments of equal length.

3. The method as recited in claim 1 further comprising the step of, prior to said step a):
   receiving said initial sequence of binary digits for decoding and error detection.

4. The method as recited in claim 1 further comprising the step of:
   e) transmitting said encoded sequence for said initial sequence of binary digits.

5. The method as recited in claim 1 wherein said step c) further comprises the step of:
   c1) storing said first encoded sequence in a first lookup table and said second encoded sequence in a second lookup table.

6. The method as recited in claim 5 wherein said step c) further comprises the steps of:
   c2) generating an encoded sequence for each possible combination of binary digits in said first segment and in said second segment;
   c3) storing in said first lookup table said encoded sequence for each possible combination of binary digits in said first segment; and
   c4) storing in said second lookup table said encoded sequence for each possible combination of binary digits in said second segment.

7. The method as recited in claim 1 wherein said code generator is for an error correcting code.

8. The method as recited in claim 7 wherein said error correcting code is a Hamming code.

* * * * *